United States Patent
Lee

(10) Patent No.: US 12,260,932 B2
(45) Date of Patent: Mar. 25, 2025

(54) STORAGE DEVICE AND OPERATING METHOD THEREOF

(71) Applicant: SK hynix Inc., Icheon-si (KR)

(72) Inventor: Seok Min Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 124 days.

(21) Appl. No.: 18/323,507

(22) Filed: May 25, 2023

(65) Prior Publication Data

US 2024/0177751 A1 May 30, 2024

(30) Foreign Application Priority Data

Nov. 30, 2022 (KR) .......................... 10-2022-0164695

(51) Int. Cl.
*G11C 7/10* (2006.01)
*G11C 7/16* (2006.01)

(52) U.S. Cl.
CPC .......... *G11C 7/1096* (2013.01); *G11C 7/1063* (2013.01); *G11C 7/109* (2013.01); *G11C 7/16* (2013.01)

(58) Field of Classification Search
CPC ..... G11C 7/1096; G11C 7/1063; G11C 7/109; G11C 7/16
See application file for complete search history.

(56) References Cited

U.S. PATENT DOCUMENTS

| 2023/0253032 A1* | 8/2023 | Lin ...................... G11C 11/4094 365/189.05 |
| 2024/0274199 A1* | 8/2024 | Lin ...................... G11C 16/0483 |

FOREIGN PATENT DOCUMENTS

| KR | 10-2017-0128080 A | 11/2017 |
| KR | 10-2020-0090089 A | 7/2020 |

OTHER PUBLICATIONS

"Numpy.unique", NumPy, URL: https://numpy.org/doc/stable/reference/generated/numpy.unique.html.
"How to count unique values based on another column in Excel?", extendoffice, URL: https://www.extendoffice.com/documents/excel/3403-excel-count-unique-based-on-another-column.html.
Hongju Kal et al., "SPACE: Locality-Aware Processing in Heterogeneous Memory for Personalized Recommendations", 2021 ACM/IEEE 48th Annual International Symposium on Computer Architecture (ISCA).

* cited by examiner

Primary Examiner — Son L Mai

(57) ABSTRACT

A storage device includes: an embedding vector manager for determining an estimated access frequency of each of a plurality of embedding vectors, based on a learning data set, and dividing the plurality of embedding vectors into a plurality of embedding vector groups, based on an order of the estimated access frequencies; and a plurality of memory cell arrays for each storing embedding vectors included in any one embedding vector group among the plurality of embedding vector groups.

19 Claims, 10 Drawing Sheets

STORAGE DEVICE AND OPERATING METHOD THEREOF

CROSS-REFERENCE TO RELATED APPLICATION

The present application claims priority under 35 U.S.C. § 119(a) to Korean patent application number 10-2022-0164695 filed on Nov. 30, 2022, in the Korean Intellectual Property Office, the entire disclosure of which is incorporated by reference herein.

BACKGROUND

1. Technical Field

The present disclosure generally relates to an electronic device, and more particularly, to a storage device and a method of operating the same.

2. Related Art

A storage device is a device that stores data under the control of a host device such as a computer or a smart phone. The storage device may include a memory device for storing data and a memory controller for controlling the memory device. The memory devices may be classified into volatile memory devices and nonvolatile memory devices.

Volatile memory devices may be memory devices in which data is stored only when power is supplied, and stored data is lost when the supply of power is interrupted. Examples of volatile memory devices may include a Static Random Access Memory (SRAM), a Dynamic Random Access Memory (DRAM), and the like.

Nonvolatile memory devices may be memory devices in which data is retained even when the supply of power is interrupted. Examples of nonvolatile memory devices may include a Read Only Memory (ROM), a Programmable ROM (PROM), an Electrically Programmable ROM (EPROM), an Electrically Erasable ROM (EEROM), a flash memory, and the like.

SUMMARY

Embodiments provide a storage device and an operating method thereof, which can improve performance of an embedding computation and reduce energy consumption.

In accordance with an aspect of the present disclosure, there is provided a storage device including: an embedding vector manager configured to determine an estimated access frequency of each of a plurality of embedding vectors, based on a learning data set, and to divide the plurality of embedding vectors into a plurality of embedding vector groups, based on an order of the estimated access frequencies; and a plurality of memory cell arrays each configured to store embedding vectors included in any one embedding vector group among the plurality of embedding vector groups.

In accordance with another aspect of the present disclosure, there is provided a method of operating a storage device, the method including: determining an estimated access frequency of each of a plurality of embedding vectors, based on a learning data set; storing, in a first memory cell, upper embedding vectors with higher the estimated access frequencies among the plurality of embedding vectors; and storing, in a second memory cell array, remaining embedding vectors among the plurality of embedding vectors, other than the upper embedding vectors.

In accordance with still another aspect of the present disclosure, there is provided a memory device including: a plurality of memory cell arrays configured to store a plurality of embedding vector groups that are grouped in a descending order of estimated access frequencies of a plurality of embedding vectors; and a computation circuit configured to output result data obtained by computing output data output from the plurality of memory cell arrays.

BRIEF DESCRIPTION OF THE DRAWINGS

Example embodiments will now be described more fully hereinafter with reference to the accompanying drawings; however, examples in the drawings may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional descriptions disclosed herein are merely illustrative for the purpose of describing embodiments according to the concepts of the present disclosure. The embodiments according to the concepts of the present disclosure can be implemented in various forms, and are not to be construed as limited to the embodiments set forth herein.

Figure 1:
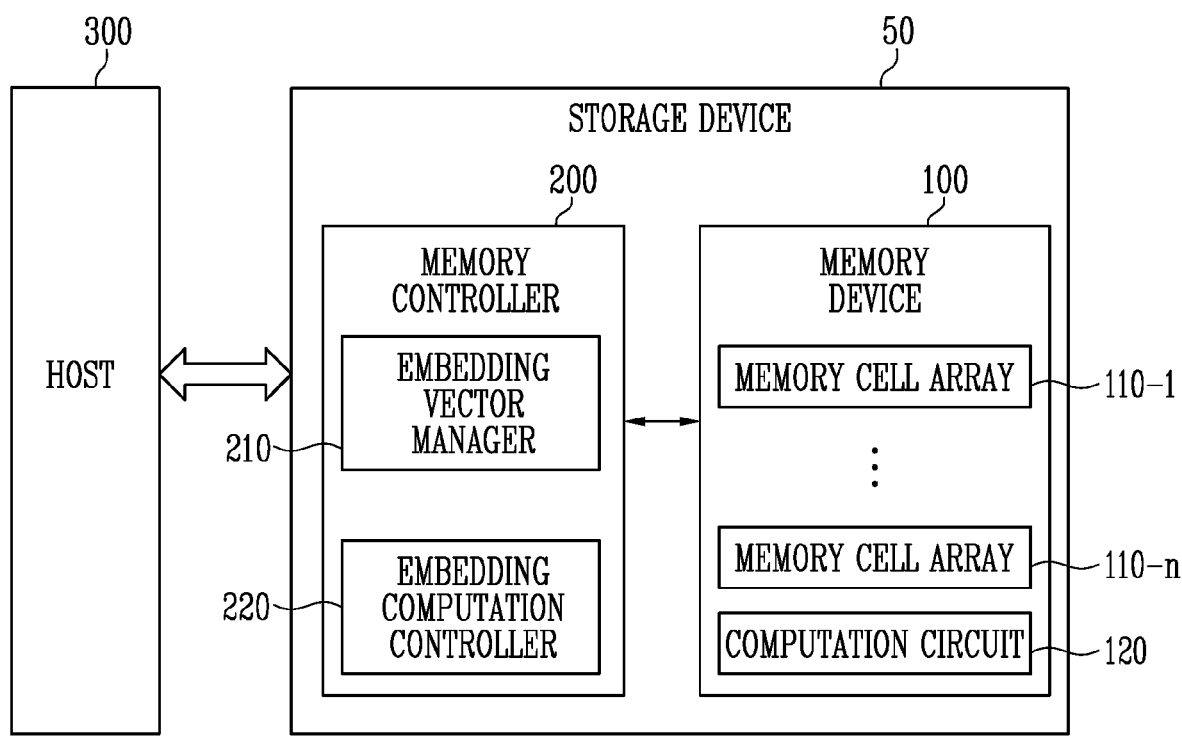
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, a storage device 50 may include a memory device 100 and a memory controller 200 for controlling an operation of the memory device 100. The storage device 50 may be a device for storing data under the control of a host 300 such as a mobile phone, a smart phone, an MP3 player, a laptop computer, a desktop computer, a game console, a TV, a tablet PC or an in-vehicle infotainment system.

The storage device 50 may be manufactured as any one of various types of storage devices according to a host interface that is a communication scheme with the host 300. For example, the storage device 50 may be configured with any one of a variety of types of storage devices, such as a Solid State Drive (SSD), a multimedia card in the form of an MMC, an eMMC, an RS-MMC and a micro-MMC, a secure digital card in the form of an SD, a mini-SD and a micro-SD, a Universal Serial Bus (USB) memory module, a Universal Flash Storage (UFS) device, a personal computer memory card international association (PCMCIA) card type memory module, a peripheral component interconnection (PCI) card type memory module, a PCI express (PCI-E) card type memory module, a Compact Flash (CF) card, a Smart Media Card (SMC), and a memory stick.

The storage device 50 may be manufactured as any one of various kinds of package types. For example, the storage device 50 may be manufactured as a Package-On-Package (POP), a System-In-Package (SIP), a System-On-Chip (SOC), a Multi-Chip Package (MCP), a Chip-On-Board (COB), a Wafer-level Fabricated Package (WFP), or a Wafer-level Stack Package (WSP).

In an embodiment, the storage device 50 and the host 300 may correspond to one component for providing a recommendation system. The recommendation system may be used to recommend items (e.g., movies, music, news, books, products, and the like) in which a user may be interested, based on information of the user. In an embodiment, a computing system may provide a recommendation system by using a machine learning-based or deep learning-based recommendation model. The recommendation model may a learning model learned using a plurality of learning data sets.

Since the recommendation system performs a memory-intensive embedding computation, a bandwidth problem may occur because a large amount of service data is required. Therefore, problems may arise when the capacity of a memory is insufficient. Accordingly, the storage device 50 may be used to efficiently perform an embedding computation.

The memory device 100 may store data. The memory device 100 may be operated under the control of the memory controller 200.

In an embodiment, the memory device 100 may include a plurality of memory cell arrays 110-1 to 110-$n$, each memory cell array including a plurality of memory cells, and a computation circuit 120.

Each of the memory cells may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits. The plurality of memory cells may be nonvolatile memory cells. Memory cells connected to the same word line may be defined as one physical page. That is, the plurality of memory cell arrays 110-1 to 110-$n$ may include a plurality of physical pages.

The plurality of memory cell arrays 110-1 to 110-$n$ may include a plurality of memory blocks (not shown). Each memory block may include a plurality of memory cells. One memory block may include a plurality of pages. In an embodiment, the page may be a unit for storing data or reading data stored in the memory device 100. The memory block may be a unit for erasing data.

In an embodiment, the plurality of memory cell arrays 110-1 to 110-$n$ may store a plurality of embedding vectors. An embedding vector may be data acquired through embedding learning using a plurality of learning data sets. For example, the plurality of embedding vectors may include data represented in an n-dimensional vector form. The data may be categorical data, which can be classified by category. For example, the categorical data may be an item in the recommendation system. That is, the embedding vector may be data in which an item is represented in a vector form. The categorical data may digitize a natural language in a vector form having bi-similarity by using an embedding algorithm. For example, a vector may be a number set configured with several integers or several floating points, such as '(3, 5)' or '(0.1, −0.5, 2, 1.2)'. As the similarity in vector values, including a slope of the embedding vector, a form of the embedding vector, and the like, increases, words have semantic meanings increasingly similar to each other.

In an embodiment, a plurality of memory cells may store component data included in the plurality of embedding vectors. The component data may be designated as a weight data.

The computation circuit 120 may perform a mathematical computation such as an addition computation, a product computation, or a Multiply And Accumulate (MAC) computation. For example, the computation circuit 120 may include a computing unit for performing the mathematical computation.

In an embodiment, the memory device 100 may become Computing In Memory (CIM), Analog Computing In Memory (ACIM), Processing In Memory (PIM), or the like.

FIG. 1 illustrates a computation circuit 120 that is one component of the memory device 100. However, the present disclosure is not necessarily limited thereto. For example, the computation circuit 120 may be implemented as an independent device separate from the memory device 100.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, the memory device 100 is assumed to be and described as a NAND flash memory.

The memory device 100 may receive a command CMD and an address ADDR from the memory controller 200, and access an area selected by the address ADDR from among the plurality of memory cell arrays 110-1 to 110-$n$. The memory device 100 may perform an operation indicated by the command CMD on the area selected by the address ADDR. For example, the memory device 100 may perform a write operation (program operation), a read operation, and an erase operation. In the write operation, the memory device 100 may program data in the area selected by the address ADDR. In the read operation, the memory device 100 may read data from the area selected by the address ADDR. In the erase operation, the memory device 100 may erase data stored in the area selected by the address ADDR.

The memory controller 200 may control overall operations of the storage device 50.

When power is applied to the storage device 50, the memory controller 200 may execute firmware (FW). When the memory device 100 is a flash memory device, the FW may include a Host Interface Layer (HIL) for controlling communication with the host 300, a Flash Translation Layer (FTL) for controlling communication between the host 300 and the memory device 100, and a Flash Interface Layer (FIL) for controlling communication with the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored. In this specification, the LBA and a "logic address" or "logical address" may be used with the same meaning. In this specification, the PBA and a "physical address" may be used with the same meaning.

The memory controller 200 may control the memory device 100 to perform a write operation, a read operation, an erase operation, or the like in response to a request from the host 300. In the write operation, the memory controller 200 may provide a write command, a physical block address, and data to the memory device 100. In the read operation, the memory controller 200 may provide a read command and a physical block address to the memory device 100. In the erase operation, the memory controller 200 may provide an erase command and a physical block address to the memory device 100.

In an embodiment, the memory controller 200 may be connected to the memory device 100 through a channel. For example, the memory controller 200 may control the memory device 100 to perform a write operation, a read operation, or an erase operation by providing a command and an address to the memory device 100 through the channel.

In an embodiment, the memory controller 200 may autonomously generate a command, an address, and data regardless or in the absence of any request from the host 300, and transmit the command, the address, and the data to the memory device 100. For example, the memory controller 200 may provide the memory device 100 with a command, an address, and data, which are used to perform read and write operations accompanied in performing wear leveling, read reclaim, garbage collection, and the like.

In an embodiment, the memory controller 200 may control at least two memory devices 100. The memory controller 200 may control the memory devices according to an interleaving scheme so as to improve operational performance. The interleaving scheme may be a scheme for controlling operations on at least two memory devices 100 to overlap with each other.

The memory controller 200 may include an embedding vector manager 210 and an embedding computation controller 220.

In an embodiment, the embedding vector manager 210 may manage embedding vectors stored in the plurality of memory cell arrays 110-1 to 110-n. For example, the embedding vector manager 210 may control the memory device 100 to store embedding vectors that have a high probability of being accessed in one memory cell array. Also, the embedding vector manager 210 may control the memory device 100 to store embedding vectors having a low probability of being accessed in a different memory cell array. That is, the embedding vector manager 210 allows embedding vectors having similar estimated access frequencies to be stored in the same memory cell array, so that an embedding computation of the memory device 100 can be efficiently performed.

Also, the embedding vector manager 210 may determine an estimated access frequency for each of the plurality of embedding vectors to estimate a probability that the plurality of embedding vectors will be accessed. The estimated access frequency may be a frequency at which the embedding vector is used for the embedding computation. Specifically, the estimated access frequency may represent a frequency at which data stored in memory cells of a row line, in which the embedding vector is stored, is read. For example, the embedding vector manager 210 may detect an estimated access frequency of each of the plurality of embedding vectors in a learning process using a learning data set. An example of determining the estimated access frequency will be described in detail later with reference to FIG. 4.

In an embodiment, the embedding computation controller 220 may control the embedding computation using the plurality of embedding vectors. For example, the embedding computation controller 220 may control the memory device 100 to perform the embedding computation by providing a command and an address to the memory device 100.

The host 300 may communicate with the storage device 50, using at least one of various communication devices or methods, such as for example a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
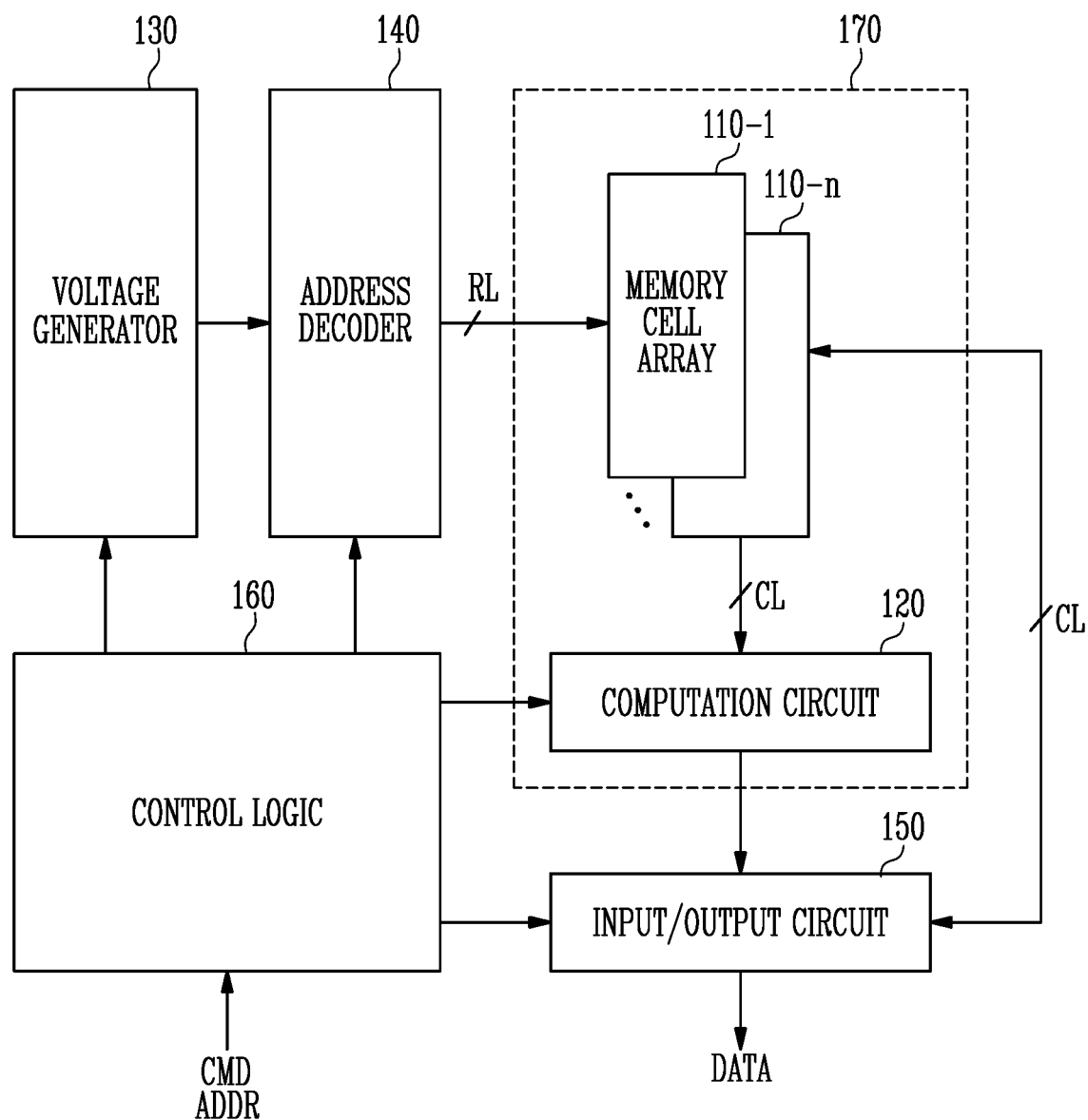
FIG. 2 is a diagram illustrating a memory device shown in FIG. 1.

FIG. 2 is a diagram illustrating a memory device shown in FIG. 1. Referring to FIG. 2, a memory device 100 may include a plurality of memory cell arrays 110-1 to 110-n, a computation circuit 120, a voltage generator 130, an address decoder 140, an input/output circuit 150, and a control logic 160.

The plurality of memory cell arrays 110-1 to 110-n may be connected to the address decoder 140 through row lines RL. The plurality of memory cell arrays 110-1 to 110-n may be connected to the computation circuit 120 and the input/output circuit 150 through column lines CL. In an embodiment, the row lines RL may include word lines, source select lines, and drain select lines. In an embodiment, the column lines CL may include bit lines.

In an embodiment, the plurality of memory cell arrays 110-1 to 110-n may store a plurality of embedding vector groups grouped together and arranged according to an ascending or descending order of estimated access frequencies of the plurality of embedding vectors.

The computation circuit 120 may output result data obtained by operations to output data from the plurality of memory cell arrays 110-1 to 110-n. The result data may be output to the input/output circuit 150.

In an embodiment, the voltage generator 130, the address decoder 140, and the input/output circuit 150 may be commonly designated as a peripheral circuit. The peripheral circuit may drive the plurality of memory cell arrays 110-1 to 110-$n$ under the control of the control logic 160. The peripheral circuit may drive the plurality of memory cell arrays 110-1 to 110-$n$ to perform a write operation, a read operation, and an erase operation.

The voltage generator 130 may generate a plurality of operating voltages by using an external power voltage supplied to the memory device 100. The voltage generator 130 may be operated under the control of the control logic 160.

In an embodiment, the voltage generator 130 may generate an internal power voltage by regulating the external power voltage. The internal power voltage generated by the voltage generator 130 may be used as an operating voltage of the memory device 100.

In an embodiment, the voltage generator 130 may generate a plurality of operating voltages by using the external power voltage or the internal power voltage. The voltage generator 130 may generate various voltages required in the memory device 100. For example, the voltage generator 130 may generate a plurality of erase voltages, a plurality of program voltages, a plurality of pass voltages, a plurality of select read voltages, and a plurality of unselect read voltages.

In order to generate a plurality of operating voltages having various voltage levels, the voltage generator 130 may include a plurality of pumping capacitors that receive the internal power voltage. The voltage generator 130 may generate the plurality of operating voltages by selectively activating the plurality of pumping capacitors under the control of the control logic 160.

The plurality of operating voltages generated by the voltage generator 130 may be supplied to the plurality of memory cell arrays 110-1 to 110-$n$ by the address decoder 140.

The address decoder 140 may be connected to the plurality of memory cell arrays 110-1 to 110-$n$ through the row lines RL. The address decoder 140 may be operated under the control of the control logic 160. The address decoder 140 may receive an address ADDR from the control logic 150. The address decoder 140 may decode an array address in the received address ADDR. The address decoder 140 may select at least one memory cell array among the plurality of memory cell arrays 110-1 to 110-$n$ according to the decoded array address. The address decoder 140 may decode a row address in the received address ADDR. The address decoder 140 may select at least one word line among word lines of the selected memory cell array according to the decoded row address. In an embodiment, the address decoder 140 may decode a column address in the received address ADDR. The address decoder 140 may connect the plurality of memory cell arrays 110-1 to 110-$n$ to the computation circuit 120 according to the decoded column address. Also, the address decoder 140 may connect the plurality of memory cell arrays 110-1 to 110-$n$ to the input/output circuit 150 according to the decoded column address.

In accordance with an embodiment of the present disclosure, in a read operation, the address decoder 140 may apply a read voltage to the selected word line, and apply a read pass voltage having a level higher than a level of the read voltage to unselected word lines.

Exemplarily, the address decoder 140 may include components such as a row decoder, a column decoder, and an address decoder.

The input/output circuit 150 may include a plurality of page buffers. The plurality of page buffers may be connected to the plurality of memory cell arrays 110-1 to 110-$n$ and the computation circuit 120 through the bit lines. In a write operation, data may be stored in selected memory cells according to data stored in the plurality of page buffers.

In a read operation, the data stored in the selected memory cells may be sensed through the bit lines, and the sensed data may be stored in the page buffers.

In addition, in a computation operation, result data acquired through computation of the computation circuit 120 may be output through the bit lines, and the output result data may be stored in the page buffers.

The control logic 160 may control the computation circuit 120, the voltage generator 130, the address decoder 140, and the input/output circuit 150. The control logic 160 may be operated in response to a command CMD transferred from an external device. The control logic 160 may control the peripheral circuit by generating control signals in response to the command CMD and the address ADDR.

In an embodiment, the memory device 100 may include a Computing In-Memory (CIM) circuit 170. The CIM circuit 170 may be configured with the plurality of memory cell arrays 110-1 to 110-$n$ and the computation circuit 120. However, in some embodiments, the CIM circuit 170 may further include other dedicated components in addition to the components shown in FIG. 2. The CIM circuit 170 may be designated as an In-Memory Computing (IMC) circuit.

The CIM circuit 170 may perform a computation operation performed in an analog manner, such as an embedding computation or a Multiply And Accumulate (MAC) computation.

In an embodiment, the CIM circuit 170 may perform an embedding computation under the control of the embedding computation controller 220. For example, each memory cell included in the plurality of memory cell arrays 110-1 to 110-$n$ may have a conductance corresponding to stored data. When a plurality of input voltages are input through the row lines RL, a current having a magnitude of I=V×G may be output through each memory cell according to the Ohm's law. The plurality of input voltages may be input through the row lines RL connected to a memory cell array in which at least one embedding vector to be accessed is stored. After that, currents output from memory cells disposed according one column line CL are joined together according to the Kirchhoff's law, and therefore, a current sum may be output along the column lines CL. The current sum may correspond to a result value of the computation operation performed in the analog manner. After that, the computation circuit 120 may output result data of the embedding computation by processing a current sum output from the plurality of memory cell arrays 110-1 to 110-$n$ through internal components.

Embedding vectors have different probabilities of whether the embedding vectors will be accessed, so embedding vectors may have different temporal localities. Therefore, when embedding vectors are stored in the plurality of memory cell arrays 110-1 to 110-$n$ without considering the temporal locality of each embedding vector, an inefficient memory access may occur in the embedding computation. For example, when embedding vectors having a high access frequency are stored in different memory cell arrays, several memory cells are to be accessed in the embedding computation, resulting in an inefficient use of energy.

Thus, in accordance with embodiments of the present disclosure, a plurality of embedding vectors are divided into a plurality of embedding vector groups, based on an ascending or descending order of estimated access frequencies of the plurality of embedding vectors, and then are stored in the plurality of memory cell arrays 110-1 to 110-$n$, so that an efficient embedding computation can be performed by temporal locality. In addition, energy consumed in an embedding computation can be reduced, and the size of a memory space can be reduced as the size of result data of the computation is reduced.

Figure 3:
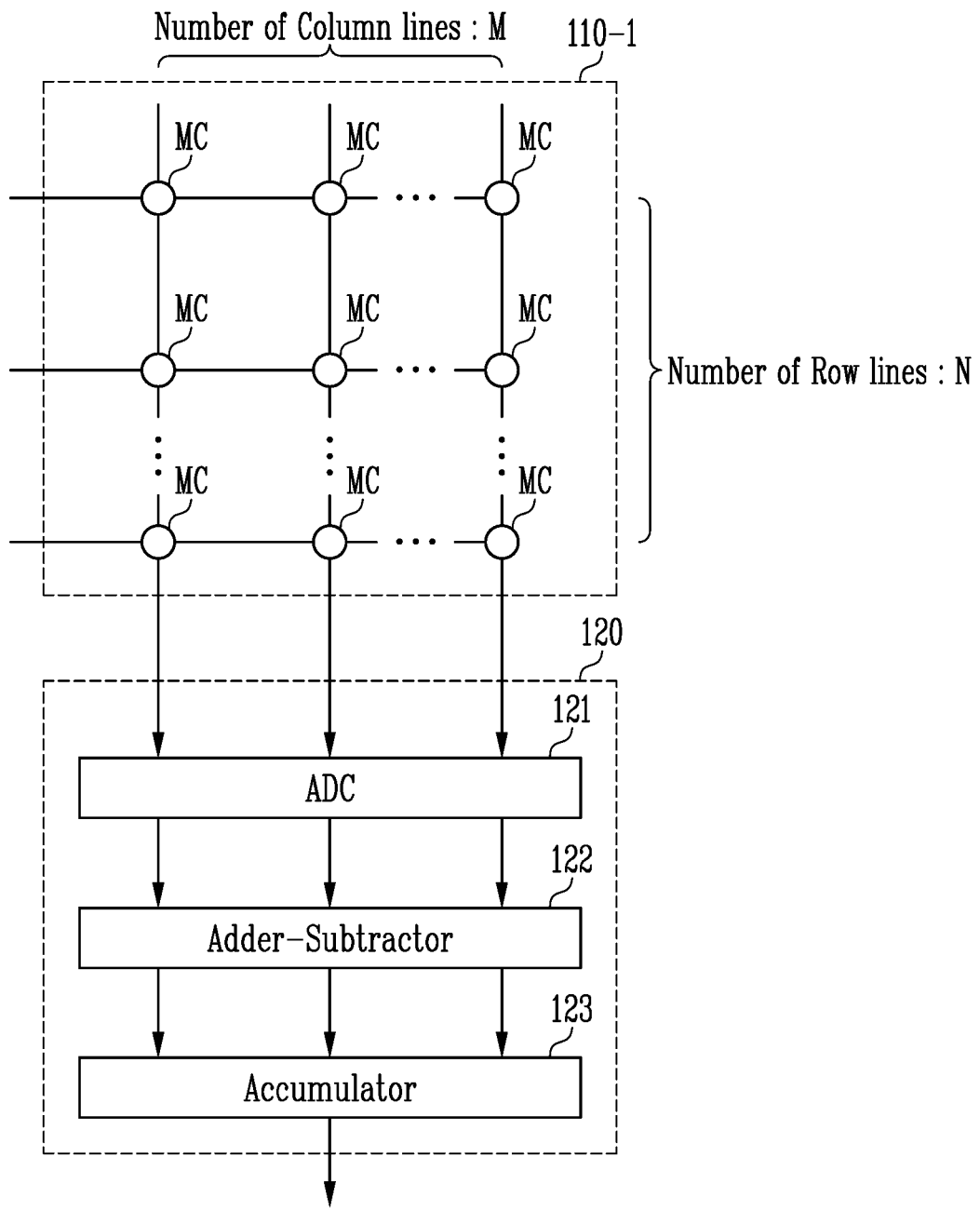
FIG. 3 is a diagram illustrating a memory cell array and a computation circuit in accordance with an embodiment of the present disclosure.

FIG. 3 is a diagram illustrating a memory cell array and a computation circuit in accordance with an embodiment of the present disclosure.

The memory cell array 110-1 shown in FIG. 3 may represent any one memory cell array 110-1 among the plurality of memory cell arrays 110-1 to 110-n shown in FIG. 2. Therefore, examples of the memory cell array 110-1 described with reference to FIG. 3 may be applied to any of the plurality of memory cell arrays 110-1 to 110-n.

Referring to FIG. 3, the memory cell array 110-1 may include a plurality of row lines, a plurality of column lines, and a plurality of memory cells MC.

The plurality of memory cells may be connected to the plurality of row lines and the plurality of column lines. Specifically, the plurality of memory cells may be located at intersection points between the plurality of row lines and the plurality of column lines.

In an embodiment, the plurality of memory cells may represent several logic values and store several-bit data. For example, the data may be weight data acquired using a learning data set. The weight data may include component data included in a plurality of embedding vectors. A change in the weight data may be performed by applying a voltage to a column line and a row line, which are connected to a memory cell.

In an embodiment, the memory cell array 110-1 may receive input data through the plurality of row lines. The input data may include a plurality of input voltages input to the respective row lines. Also, the input data may be configured with a single bit.

In an embodiment, the memory cell array 110-1 may output, according to data input through the plurality of column lines and data stored in the memory cells, output data. The output data may include a plurality of output currents that are output through the respective column lines. The output data may be output to the computation circuit 120.

Although the number of the plurality of row lines is N and the number of the plurality of column lines is M in FIG. 3, the present disclosure is not limited thereto. The numbers of the plurality of row lines and the plurality of column lines may be variously set in some other embodiments.

In an embodiment, the computation circuit 120 may include an analog-digital converter (ADC) 121, an adder-subtractor 122, and an accumulator 123.

The ADC 121 may convert output data, which is output from the memory cell array 110-1, from an analog form to a digital form.

The adder-subtractor 122 may output a final current value by adding or subtracting current sums output through the respective column lines.

The accumulator 123 may output result data as an embedding computation by accumulating final current sums output from the plurality of memory cell arrays 110-1 to 110-n.

In an embodiment, the plurality of memory cell arrays 110-1 to 110-n may share the ADC 121, the adder-subtractor 122, and the accumulator 123.

However, unlike the above-described example, in other embodiments each of the plurality of memory cell arrays 110-1 to 110-n may be connected to a separate ADC 121, a separate adder-subtractor 122, and a separate accumulator 123.

Figure 4:
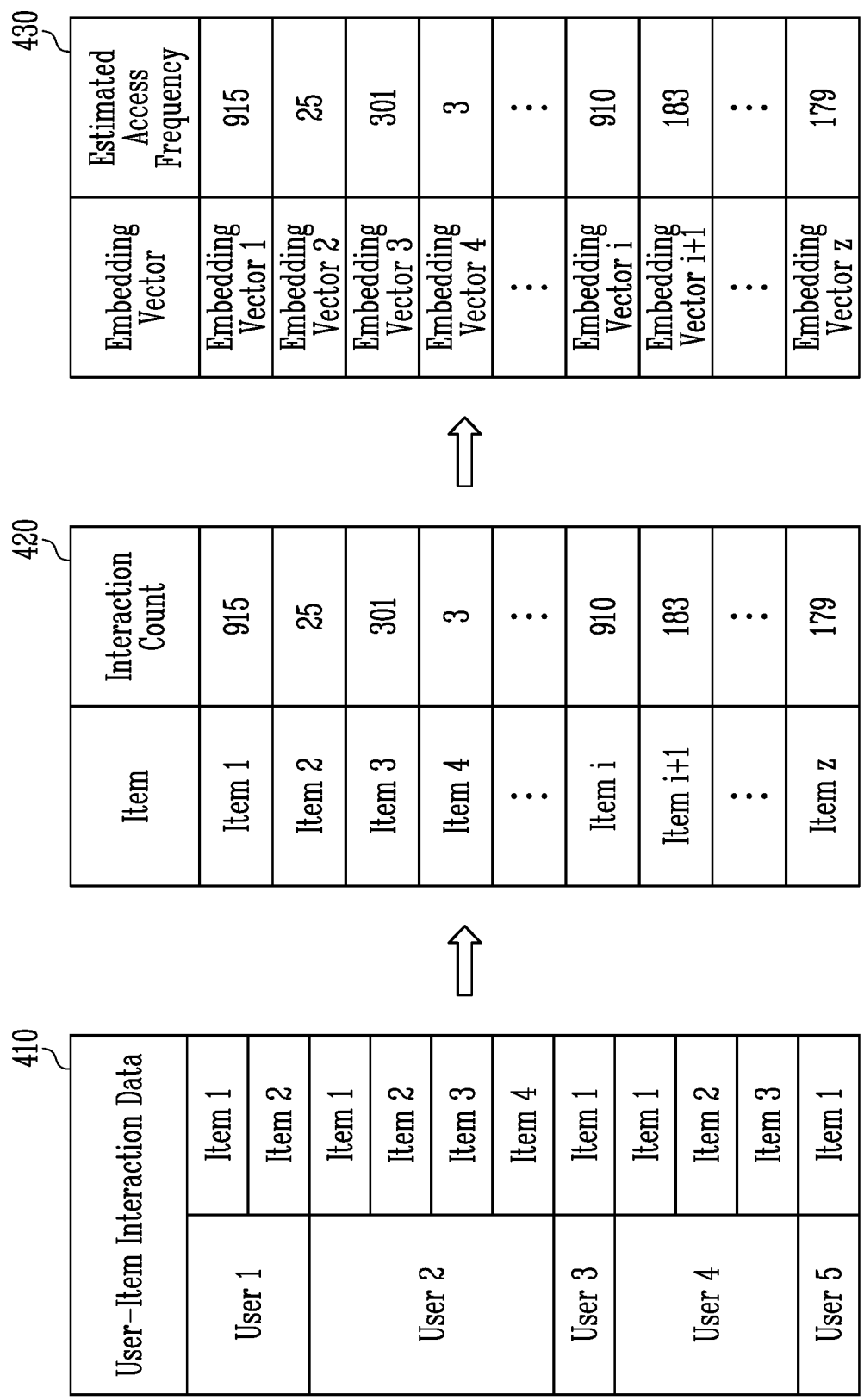
FIG. 4 is a diagram illustrating an example of determining an estimated access frequency of each of a plurality of embedding vectors in accordance with an embodiment of the present disclosure.

FIG. 4 is a diagram illustrating an example of determining an estimated access frequency of each of a plurality of embedding vectors in accordance with an embodiment of the present disclosure.

FIG. 4 illustrates an embedding vector manager 210, which may determine an estimated access frequency of each of a plurality of embedding vectors based on a learning data set. The learning data set may be data used to allow a recommendation model used for a recommendation system to be learned.

In an embodiment, the learning data set includes user-item interaction data 410. The user-item interaction data 410 may be interaction data between a plurality of users and a plurality of items (Item 1 to Item z, for example) corresponding to each of the plurality of embedding vectors. In an example, the user-item interaction data may include records about the users' interaction with each item.

In an embodiment, the embedding vector manager 210 may generate data 420 representing an interaction number for each item, based on the user-item interaction data 410. For example, the embedding vector manager 210 may generate the data 420 representing an interaction number for each item from the user-item interaction data 410 through various count unique value algorithms.

In an embodiment, the embedding vector manager 210 may generate the data 420 representing an interaction number for each item in a learning process of the recommendation model.

In an embodiment, the embedding vector manager 210 may generate data 430 representing an estimated access frequency for each embedding vector, based on the data 420 representing an interaction number for each item. For example, the embedding vector manager 210 may determine an estimated access frequency of a plurality of embedding vectors (Embedding Vector 1 to Embedding Vector z), based on a number of times each of the plurality of items Item 1 to Item z interacts with the plurality of users. Specifically, the embedding vector manager 210 may determine an interaction number for each item as an estimated access frequency for each embedding vector, which corresponds to each item.

Although not shown in the drawing, the embedding vector manager 210 may align the data representing an estimated access frequency for each embedding vector, based on an ascending or descending order of estimated access frequencies.

Figure 5:
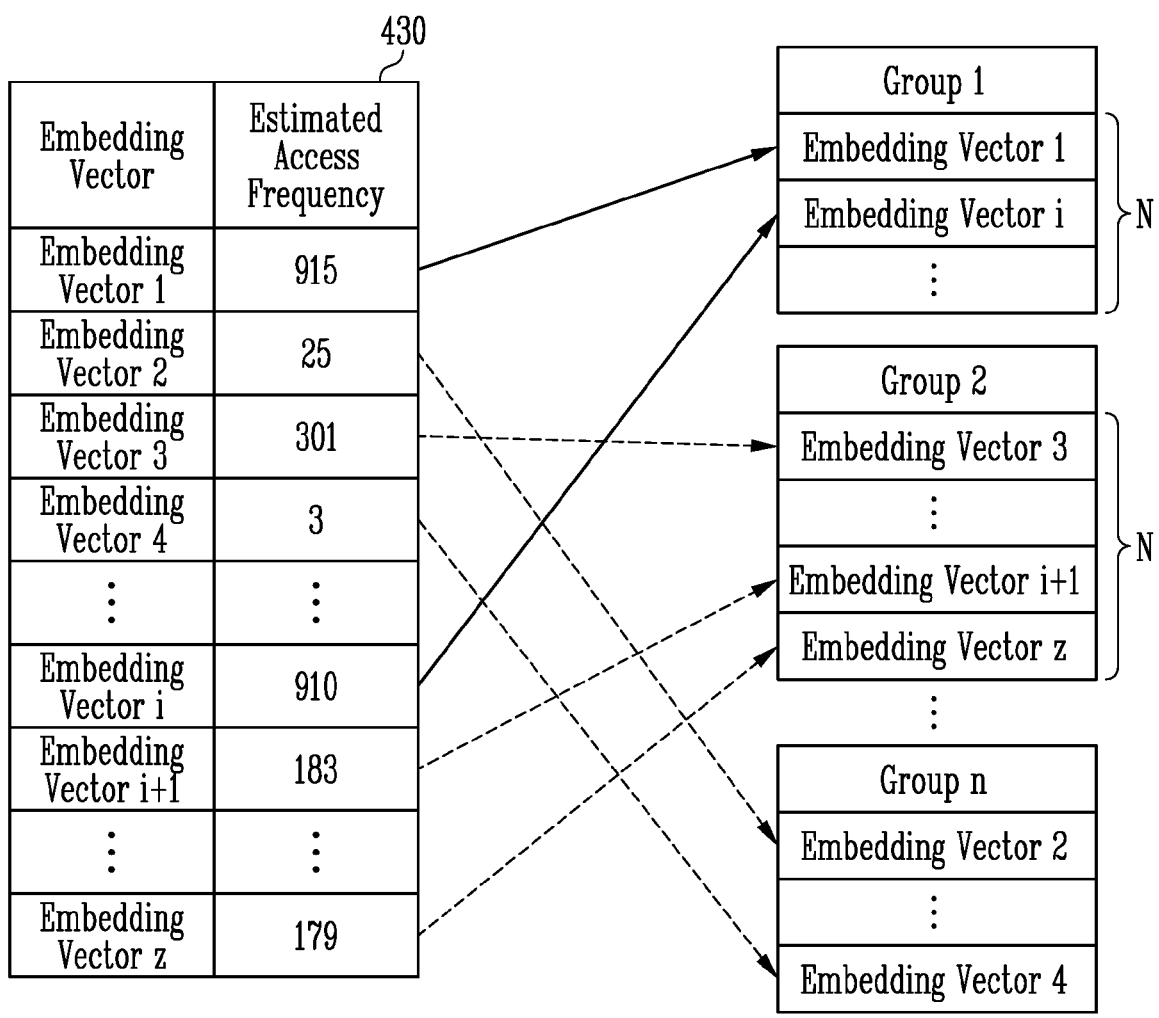
FIG. 5 is a diagram illustrating an example of dividing a plurality of embedding vectors into a plurality of embedding vector groups in accordance with an embodiment of the present disclosure.

FIG. 5 is a diagram illustrating an example of dividing a plurality of embedding vectors into a plurality of embedding vector groups in accordance with an embodiment of the present disclosure.

Referring to FIG. 5, an embedding vector manager 210 may divide the plurality of embedding vectors Embedding Vector 1 to Embedding Vector z into a plurality of embedding vector groups Group 1 to Group n, based on a descending order of estimated access frequencies.

In an embodiment, the embedding vector manager 210 may group the plurality of embedding vectors Embedding Vector 1 to Embedding Vector z for every predetermined number, based on the order of estimated access frequencies.

In an embodiment, the embedding vector manager 210 may group the plurality of embedding vectors Embedding Vector 1 to Embedding Vector z such that the plurality of embedding vector groups Group 1 to Group n include embedding vectors equal in number to a plurality of row lines.

For example, when the plurality of memory cell arrays include N row lines, the embedding vector manager 210 may group N embedding vectors as one embedding vector group, based on the descending order of estimated access frequencies. When an estimated access frequency of embedding vector 1 Embedding Vector 1 is highest among the plurality of embedding vectors Embedding Vector 1 to Embedding Vector z, the Embedding Vector 1 may be included in embedding vector group 1 Group 1. In addition, when an estimated access frequency of embedding vector i is next highest to the embedding vector 1, the Embedding Vector i may be included in the embedding vector Group 1. When N embedding vectors are included in the embedding vector Group 1, embedding vector 3, which has the next highest estimated access frequency may be included in embedding vector Group 2. The embedding vector manager 210 may divide the plurality of embedding vectors Embedding Vector 1 to Embedding Vector z into the plurality of embedding vector groups Group 1 to Group n through the above-described grouping manner. In some embodiments, a number of embedding vectors included last embedding vector group n Group n may less than an N number of the plurality of row lines.

Figure 6:
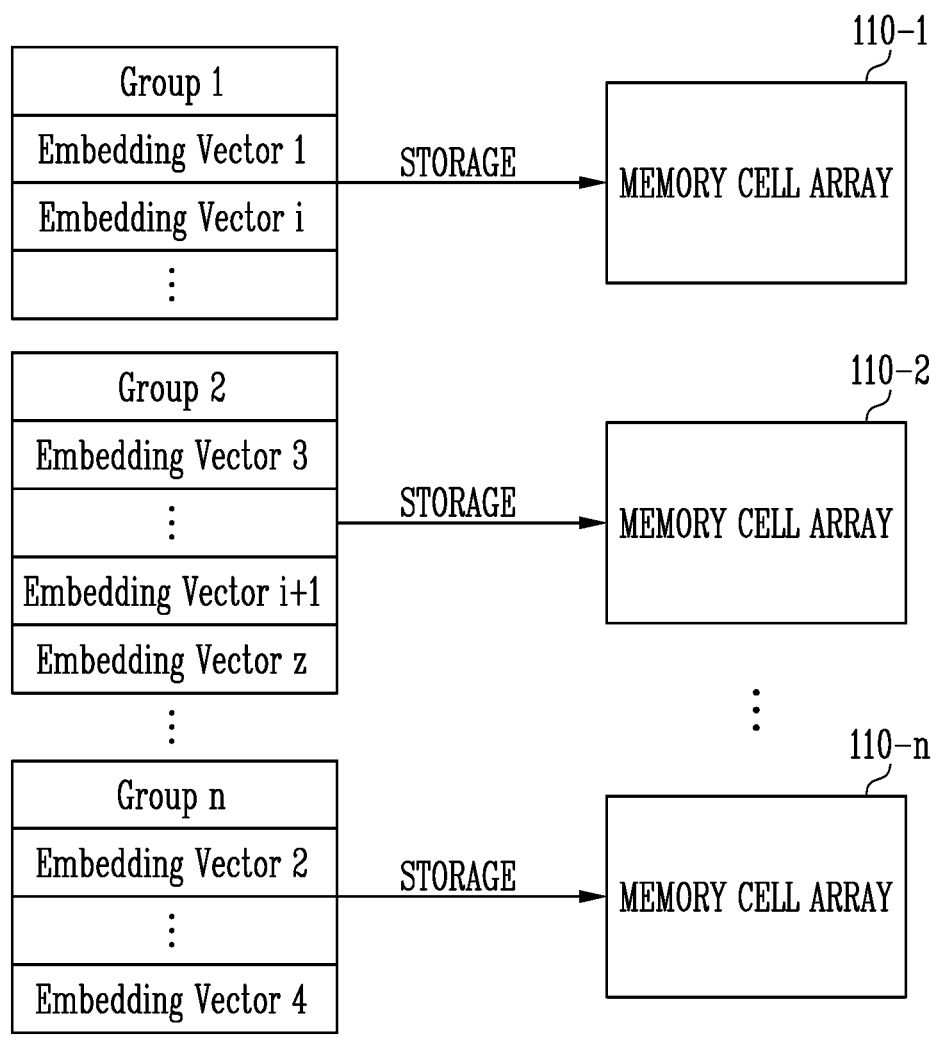
FIG. 6 is a diagram illustrating an example of storing a plurality of embedding vector groups in a plurality of memory cell arrays in accordance with an embodiment of the present disclosure.

FIG. 6 is a diagram illustrating an example of storing a plurality of embedding vector groups in a plurality of memory cell arrays in accordance with an embodiment of the present disclosure.

Referring to FIG. 6, an embedding vector manager 210 may control a memory device 100 to store a plurality of embedding vector groups Group 1 to Group n in a plurality of memory cell arrays 110-1 to 110-n.

For example, each of the plurality of memory cell arrays 110-1 to 110-n may store embedding vectors included in any one embedding vector group among the plurality of embedding vector groups Group 1 to Group n. The plurality of memory cells 110-1 to 110-n may store embedding vectors included in different embedding vector groups.

Figure 7:
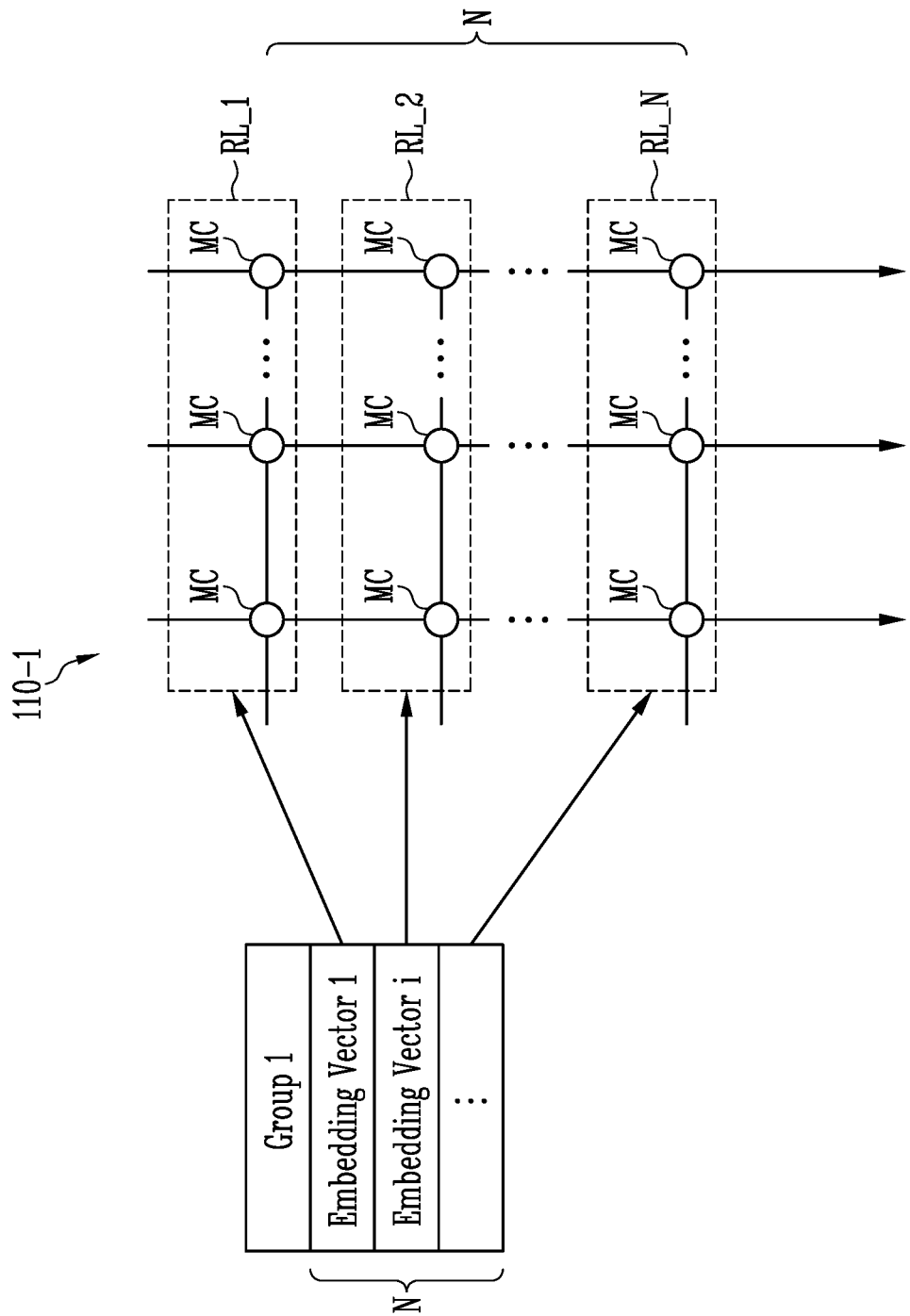
FIG. 7 is a diagram illustrating an example of storing embedding vectors included in an embedding vector group in a memory cell array in accordance with an embodiment of the present disclosure.

FIG. 7 is a diagram illustrating an example of storing embedding vectors included in an embedding vector group in a memory cell array in accordance with an embodiment of the present disclosure.

A memory cell array 110-1 shown in FIG. 7 may represent any one memory cell array 110-1 among a plurality of memory cell arrays 110-1 to 110-n shown in FIG. 2. Therefore, examples of the memory cell array 110-1 described with reference to FIG. 7 may be applied to any of the plurality of memory cell arrays 110-1 to 110-n.

Referring to FIG. 7, a plurality of memory cells MC may store component data included in a plurality of embedding vectors.

For example, when embedding vectors included in embedding vector group 1 (Group 1) are stored in the memory cell array 110-1, one embedding vector among the embedding vectors included in the embedding vector group 1 may be allocated to each row line of the memory cell array 110-1. Embedding vector 1 (Embedding Vector 1) may be allocated to a first row line RL_1, and memory cells connected to the first row line RL_1 may store component data included in the embedding vector 1. In addition, embedding vector i (Embedding Vector i) may be allocated to a second row line RL_2, and memory cells connected to the second row line RL_2 may store component data included in the embedding vector i.

Figure 8:
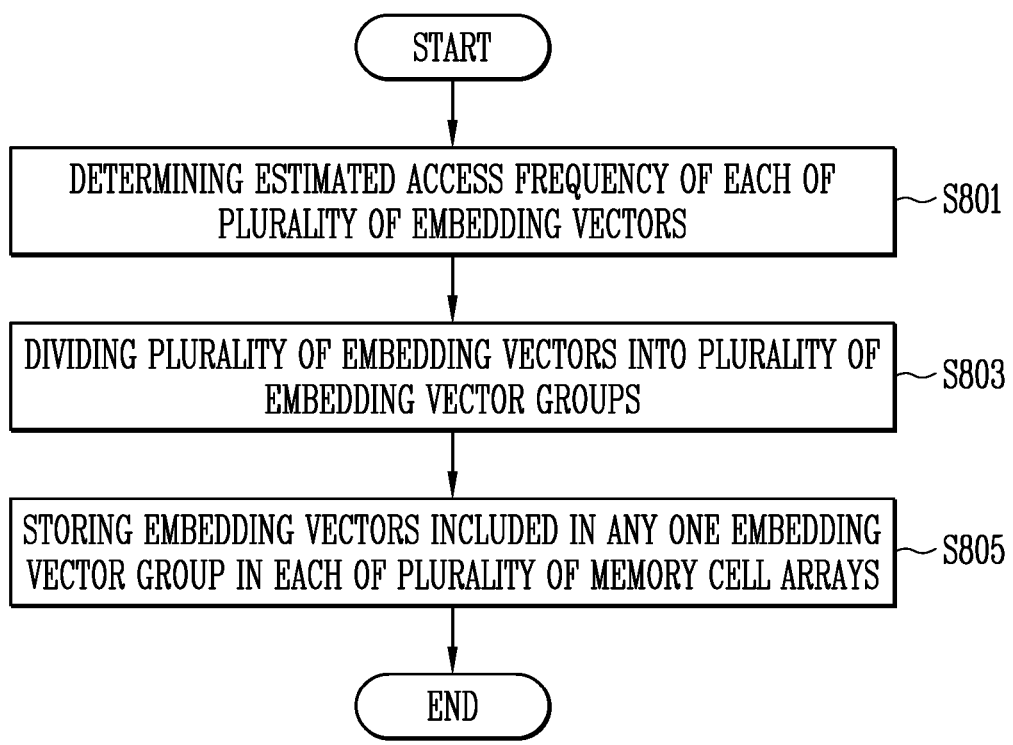
FIG. 8 is a flowchart illustrating an example of an operating method of a storage device in accordance with an embodiment of the present disclosure.

FIG. 8 is a flowchart illustrating an example of an operating method of a storage device in accordance with an embodiment of the present disclosure.

The operating method shown in FIG. 8 may be performed by a storage device 50 shown in FIG. 1.

Referring to FIG. 8, in step S801, the storage device 50 may determine an estimated access frequency of each of a plurality of embedding vectors, based on a learning data set.

In step S803, the storage device 50 divides the plurality of embedding vectors into a plurality of embedding vector groups, based on the order of the estimated access frequencies.

In step S805, the storage device 50 may store, in each of a plurality of memory cell arrays, embedding vectors included in any one embedding vector group among the plurality of embedding vector groups.

Figure 9:
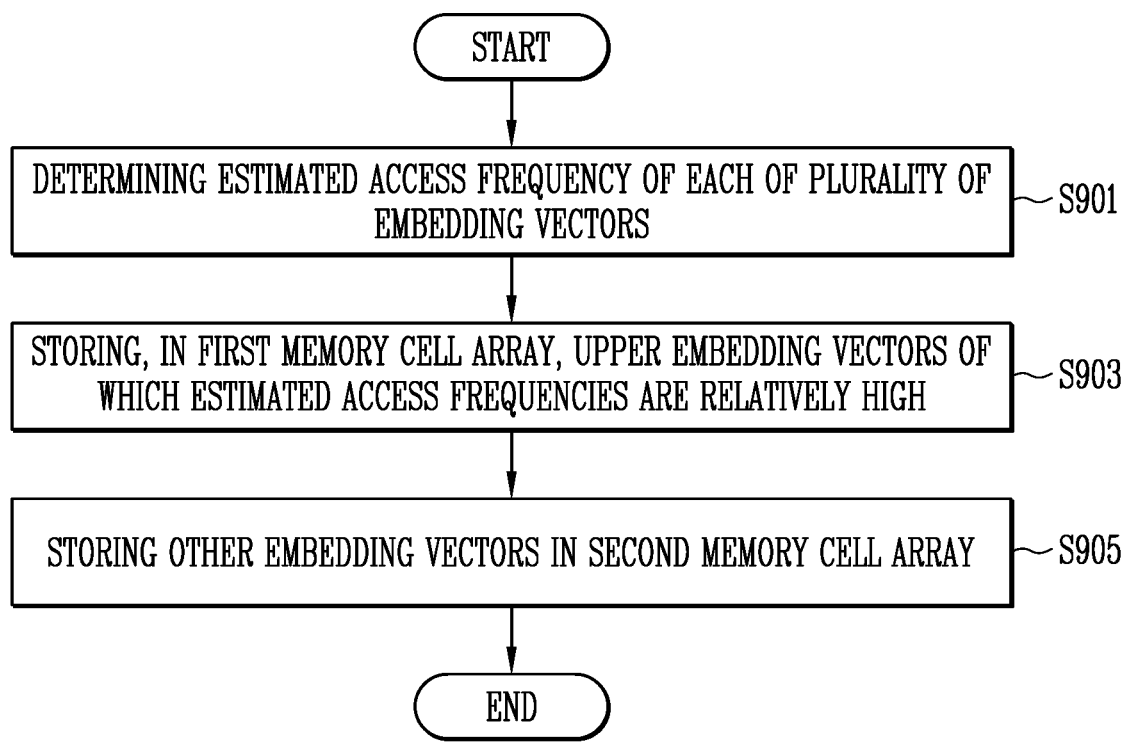
FIG. 9 is a flowchart illustrating another example of an operating method of a storage device in accordance with an embodiment of the present disclosure.

FIG. 9 is a flowchart illustrating another example of an operating method of a storage device in accordance with an embodiment of the present disclosure.

An operating method shown in FIG. 9 may be performed by a storage device 50 shown in FIG. 1. Unlike the operating method shown in FIG. 8, the operating method shown in FIG. 9 represents a method of immediately storing a plurality of embedding vectors in a plurality of memory cells, based on estimated access frequencies, without performing any separate grouping operation.

Referring to FIG. 9, in step S901, the storage device 50 may determine an estimated access frequency of each of a plurality of embedding vectors, based on a learning data set.

In step S903, the storage device 50 may store, in a first memory cell array, upper embedding vectors of which estimated access frequencies are relatively high among the plurality of embedding vectors. The upper embedding vectors may include embedding vectors in a number that is equal to a number of a plurality of row lines included in the first memory cell array.

In step S905, the storage device 50 may store, in a second memory cell array, the remaining other embedding vectors among the plurality of embedding vectors, excluding the upper embedding vectors.

Figure 10:
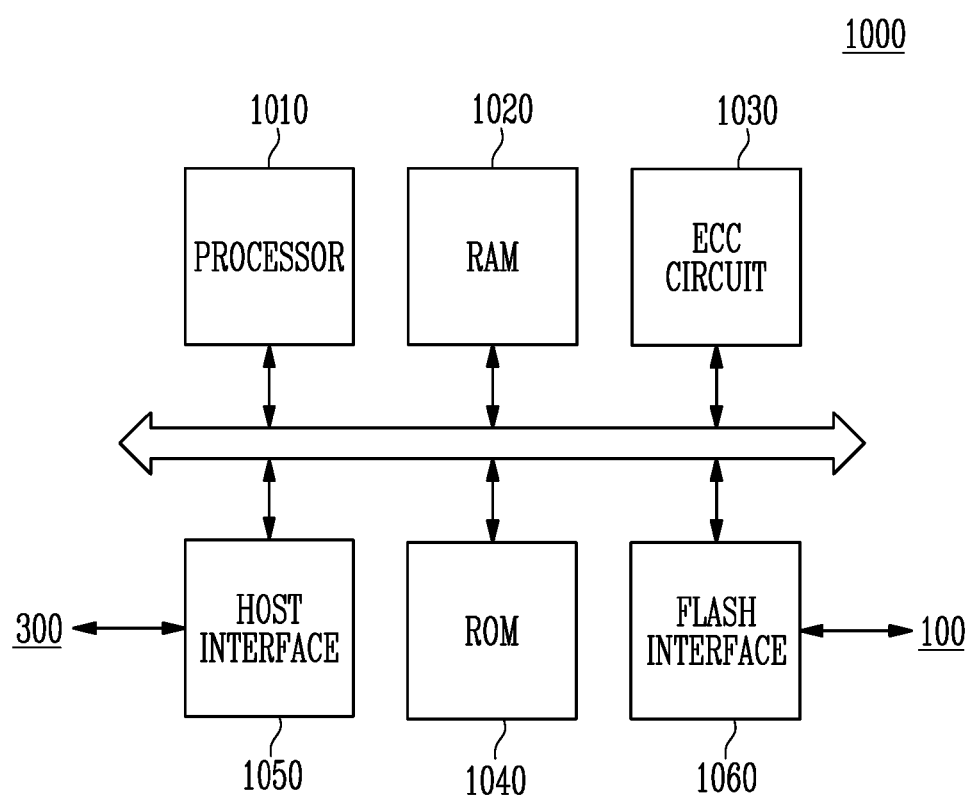
FIG. 10 is a diagram illustrating an embodiment of a memory controller shown in FIG. 1.

FIG. 10 is a diagram illustrating an embodiment of the memory controller shown in FIG. 1.

Referring to FIGS. 1 and 10, a memory controller 1000 may include a processor 1010, a RAM 1020, an Error Correction Code (ECC) circuit 1030, a ROM 1040, a host interface 1050, and a flash interface 1060.

The processor 1010 may control a general operation of the memory controller 1000. In an embodiment, an embedding vector manager 210 and an embedding computation controller 220, which are shown in FIG. 1, may be implemented as one component of the processor 1010. Therefore, the processor 1010 may equally perform operations of the embedding vector manager 210 and the embedding computation controller 220, which are described with reference to FIG. 1.

For example, the processor 1010 may determine an estimated access frequency of each of a plurality of embedding vectors, based on a learning data set. The processor 1010 may divide the plurality of embedding vectors into a plurality of embedding vector groups, based on the estimated access frequencies. The processor 1010 may control the memory device 100 to store the plurality of embedding vector groups in the plurality of memory cell arrays 110-1 to 110-n. Also, the processor 1010 may provide a command and an address to the memory device 100, to control an embedding computation of the memory device 100.

The RAM 1020 may be used as a buffer memory, a cache memory, a working memory, or the like of the memory controller 1000.

The ECC circuit 1030 may perform error correction. The ECC circuit 1030 may perform ECC encoding, based on data written in the memory device 100 through the flash interface 1060. The ECC-encoded data may be transferred to the memory device 100 through the flash interface 1060. The ECC circuit 1030 may perform ECC decoding on data received from the memory device 100 through the flash interface 1060. Exemplarily, the ECC circuit 1030 may be included as a component of the flash interface 1060, within the flash interface 1060.

The ROM 1040 may store, in a firmware form, various information required when the memory controller 1000 is operated.

The memory controller 1000 may communicate with an external device (e.g., the host 300, an application processor, or the like) through the host interface 1050.

The memory controller 1000 may communicate with the memory device 100 through the flash interface 1060. The memory controller 1000 may transmit a command, an address, a control signal, and the like to the memory device 100 through the flash interface 1060, and receive data. Exemplarily, the flash interface 1060 may include a NAND interface.

In accordance with the present disclosure, there can be provided a storage device and an operating method thereof, which can improve performance of an embedding computation and reduce energy consumption.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A storage device comprising:
   an embedding vector manager configured to determine an estimated access frequency of each of a plurality of embedding vectors, based on a learning data set, and to divide the plurality of embedding vectors into a plurality of embedding vector groups, based on an order of the estimated access frequencies; and
   a plurality of memory cell arrays each configured to store embedding vectors included in any one embedding vector group among the plurality of embedding vector groups.

2. The storage device of claim 1, wherein the learning data set includes interaction data between a plurality of users and a plurality of items corresponding to each of the plurality of embedding vectors.

3. The storage device of claim 2, wherein the embedding vector manager determines the estimated access frequency, based on a number of times each of the plurality of items interacts with the plurality of users.

4. The storage device of claim 1, wherein the embedding vector manager groups the plurality of embedding vectors for every predetermined number, based on a descending order of the estimated access frequencies.

5. The storage device of claim 1, wherein the plurality of memory cell arrays include:
   a plurality of row lines;
   a plurality of column lines; and
   a plurality of memory cells connected to the plurality of row lines and the plurality of column lines, the plurality of memory cells storing component data included in the plurality of embedding vectors.

6. The storage device of claim 5, wherein the embedding vector manager groups, into each of the plurality of embedding vector groups, a number of embedding vectors equal to a number of the plurality of row lines.

7. The storage device of claim 5, wherein the plurality of memory cell arrays receive a plurality of input voltages that are input through the plurality of row lines, perform a computation operation in an analog manner, based on the plurality of input voltages and the stored component data, and output a result value of the computation operation through the plurality of column lines.

8. The storage device of claim 7, wherein the computation operation in the analog manner is an operation in which currents are output from the plurality of memory cells in which the component data are stored by the plurality of input voltages, and a sum of currents output from memory cells disposed in each of the plurality of column lines is output.

9. The storage device of claim 7, further comprising a computation circuit configured to output result data of an embedding computation by processing the result value of the computation operation.

10. A method of operating a storage device, the method comprising:
   determining an estimated access frequency of each of a plurality of embedding vectors, based on a learning data set;
   storing, in a first memory cell, upper embedding vectors with higher estimated access frequencies among the plurality of embedding vectors; and
   storing, in a second memory cell array, remaining embedding vectors among the plurality of embedding vectors, other than the upper embedding vectors.

11. The method of claim 10, wherein the learning data set includes interaction data between a plurality of users and a plurality of items corresponding to each of the plurality of embedding vectors.

12. The method of claim 11, wherein the estimated access frequency is determined based on a number of times each of the plurality of items interacts with the plurality of users.

13. The method of claim 10, wherein the upper embedding vectors include a number of embedding vectors equal to a number of a plurality of row lines included in the first memory cell.

14. The method of claim 10, further comprising:
inputting a plurality of input voltages through a plurality of row lines connected to a specific memory cell array in which at least one embedding vector to be accessed is stored among the first and second memory cell arrays;
performing a computation operation in an analog manner, based on the plurality of input voltages and component data included in the embedding vectors stored in the specific memory cell array; and
outputting a result value of the computation operation through a plurality of column lines connected to the specific memory cell array.

15. A memory device comprising:
a plurality of memory cell arrays configured to store a plurality of embedding vector groups that are grouped in a descending order of estimated access frequencies of a plurality of embedding vectors; and
a computation circuit configured to output result data obtained by computing output data output from the plurality of memory cell arrays.

16. The memory device of claim 15, wherein the estimated access frequency is determined based on a number of times each of a plurality of items corresponding to each the plurality of embedding vectors interacts with a plurality of users.

17. The memory device of claim 15, wherein the plurality of memory cell arrays include:
a plurality of row lines;
a plurality of column lines; and
a plurality of memory cells connected to the plurality of row lines and the plurality of column lines, the plurality of memory cells storing component data included in the plurality of embedding vectors.

18. The memory device of claim 17, wherein each of the plurality of embedding vector groups includes a number of embedding vectors equal to a number of the plurality of row lines.

19. The memory device of claim 17, wherein the computation circuit includes:
an analog-digital converter configured to convert the output data from an analog form to a digital form;
an adder/subtractor configured to output final current sums by adding or subtracting current sums output respectively through the plurality of column lines; and
an accumulator configured to output the result data as a result of an embedding computation by accumulating the final current sums.

* * * * *